(12) United States Patent
Nandipaku et al.

(10) Patent No.: US 7,558,542 B2
(45) Date of Patent: Jul. 7, 2009

(54) SYSTEM AND METHOD FOR PROVIDING A TRANSMITTER FOR POLAR MODULATION AND POWER AMPLIFIER LINEARIZATION

(75) Inventors: Sanjay Nandipaku, North Andover, MA (US); Roxann Blanchard, Chester, NH (US); Robert Broughton, Chester, NH (US); Robert G. Gels, Boston, MA (US); Cecile Masse, Methuen, MA (US)

(73) Assignee: Mediatek Inc., Hsin-Chu (TW)

( * ) Notice: Subject to any disclaimer, the term of this patent is extended or adjusted under 35 U.S.C. 154(b) by 473 days.

(21) Appl. No.: 11/450,115

(22) Filed: Jun. 9, 2006

(65) Prior Publication Data
US 2007/0287393 A1 Dec. 13, 2007

(51) Int. Cl.
*H01Q 11/12* (2006.01)
*H04B 1/04* (2006.01)
(52) U.S. Cl. .................................... 455/127.2; 332/145
(58) Field of Classification Search .............. 455/127.1, 455/127.2, 127.3, 126; 332/144–145, 149; 375/295
See application file for complete search history.

(56) References Cited

U.S. PATENT DOCUMENTS

| | | | |
|---|---|---|---|
| 7,072,420 B2 * | 7/2006 | Persson | 375/297 |
| 7,072,626 B2 * | 7/2006 | Hadjichristos | 455/126 |
| 2002/0196864 A1 * | 12/2002 | Booth et al. | 375/296 |
| 2004/0235437 A1 | 11/2004 | Gels et al. | |
| 2007/0026834 A1 * | 2/2007 | Yahagi et al. | 455/313 |
| 2007/0054635 A1 * | 3/2007 | Black et al. | 455/127.1 |
| 2007/0290748 A1 * | 12/2007 | Woo et al. | 330/149 |

FOREIGN PATENT DOCUMENTS

| | | |
|---|---|---|
| GB | 2380880 | 4/2003 |
| WO | 0247249 | 6/2002 |
| WO | 02060088 | 8/2002 |

* cited by examiner

*Primary Examiner*—Nguyen Vo
(74) *Attorney, Agent, or Firm*—Winston Hsu

(57) ABSTRACT

A transmitter circuit is disclosed for use in a multi-frequency wireless communication system. The transmitter circuit includes an input modulation unit, a phase modulation system, and an amplitude modulation system. The input modulation unit receives at least one signal that is representative of information to be modulated. The phase modulation system is coupled to the input modulation unit and provides a phase modulation on an output signal. The phase modulation system includes a phase detection system and an adjustable power amplifier. The amplitude modulation system is coupled to the input modulation unit and provides amplitude modulation on the output signal. The amplitude modulation system includes an amplitude detection system for providing an output signal to the adjustable power amplifier, and a variable gain amplifier coupled to the adjustable power amplifier.

21 Claims, 7 Drawing Sheets

SYSTEM AND METHOD FOR PROVIDING A TRANSMITTER FOR POLAR MODULATION AND POWER AMPLIFIER LINEARIZATION

BACKGROUND

The invention generally relates to systems and methods for transmitting and receiving wireless communication, and relates in particular to transceivers for wireless telecommunication systems.

Modulation of a carrier with a baseband signal can be achieved using a polar representation of the signal representing the baseband signal as magnitude and phase components. These components are translated onto an RF carrier by functional blocks that modulate the carrier phase and amplitude independently. For reasons of power efficiency combining the component signals is ideally performed at the final stage of the transmitter, which typically is a non-linear power amplifier (PA). When a modulator is implemented in this fashion, time-alignment of the phase and magnitude components is critical for modulated signal integrity.

In addition to modulated signal quality, accurate power control is required by many RF wireless communications standards, such as the GSM/EDGE standard. A transmitter is required to be able to accurately transmit at any of the pre-desired power levels. While it is possible to achieve this goal using open-loop schemes, a closed-loop power control is desirable.

Polar closed-loop systems have been used for many years in transmitter systems. For example *Polar-Loop Transmitter*, by V. Petrovic & W. Gosling, Electronics Letters, vol. 15, No. 10, (1979) discloses a polar-loop transmitter. U.S. Pat. No. 6,801,784 discloses a continuous closed-loop control system for a wireless transceiver power amplifier that includes modulation injection. See also, *An IC for Linearizing RF Power Amplifiers Using Envelope Elimination and Restoration* by Su and McFarland, IEEE, JSSC, December 1988, which also discloses systems for closed-loop envelope control.

In a mobile terminal application, typically phase modulation of a carrier is achieved through the use of a phase locked loop. Most common PLL implementations include a phase-locked loop implementation as an offset PLL with a Type 2 loop transfer function (i.e., two poles at zero frequency). Output amplitude (and therefore power) control is typically obtained by using a Type 1 loop.

Polar modulators however, typically have strict time-alignment requirements between the phase and amplitude components. Control of timing-alignment requires control of open-loop gain and bandwidth (3 dB) and phase response of the loops. Maintaining timing alignment over a range of power levels is difficult in certain applications due to non-idealities in the components used.

There is a need therefore, for a more efficient and economic transceiver system for providing a transmitter system in a transceiver system that is linear over a broad range of operating powers and frequencies.

SUMMARY

The invention provides a transmitter circuit for use in a multi-frequency wireless communication system in accordance with an embodiment of the invention. The transmitter circuit includes an input modulation unit, a phase modulation system, and an amplitude modulation system. The input modulation unit receives at least one signal that is representative of information to be modulated. The phase modulation system is coupled to the input modulation unit and provides a phase modulation on an output signal. The phase modulation system includes a phase locked loop and an adjustable power amplifier such as Adjustable Power Control power amplifier. The amplitude modulation system is coupled to the input modulation unit and provides amplitude modulation on the output signal. The amplitude modulation system includes an envelope restoration and power control system for providing an output signal to the adjustable power amplifier.

In certain embodiments, the amplitude modulation system includes a variable gain amplifier coupled to the adjustable power amplifier. In further embodiments, the amplitude modulation system includes a log amplifier coupled to the output signal.

BRIEF DESCRIPTION OF THE ILLUSTRATED EMBODIMENTS

The following description may be further understood with reference to the accompanying drawings in which.

The drawings are shown for illustrative purposes only.

DETAILED DESRIPTION

Figure 1:
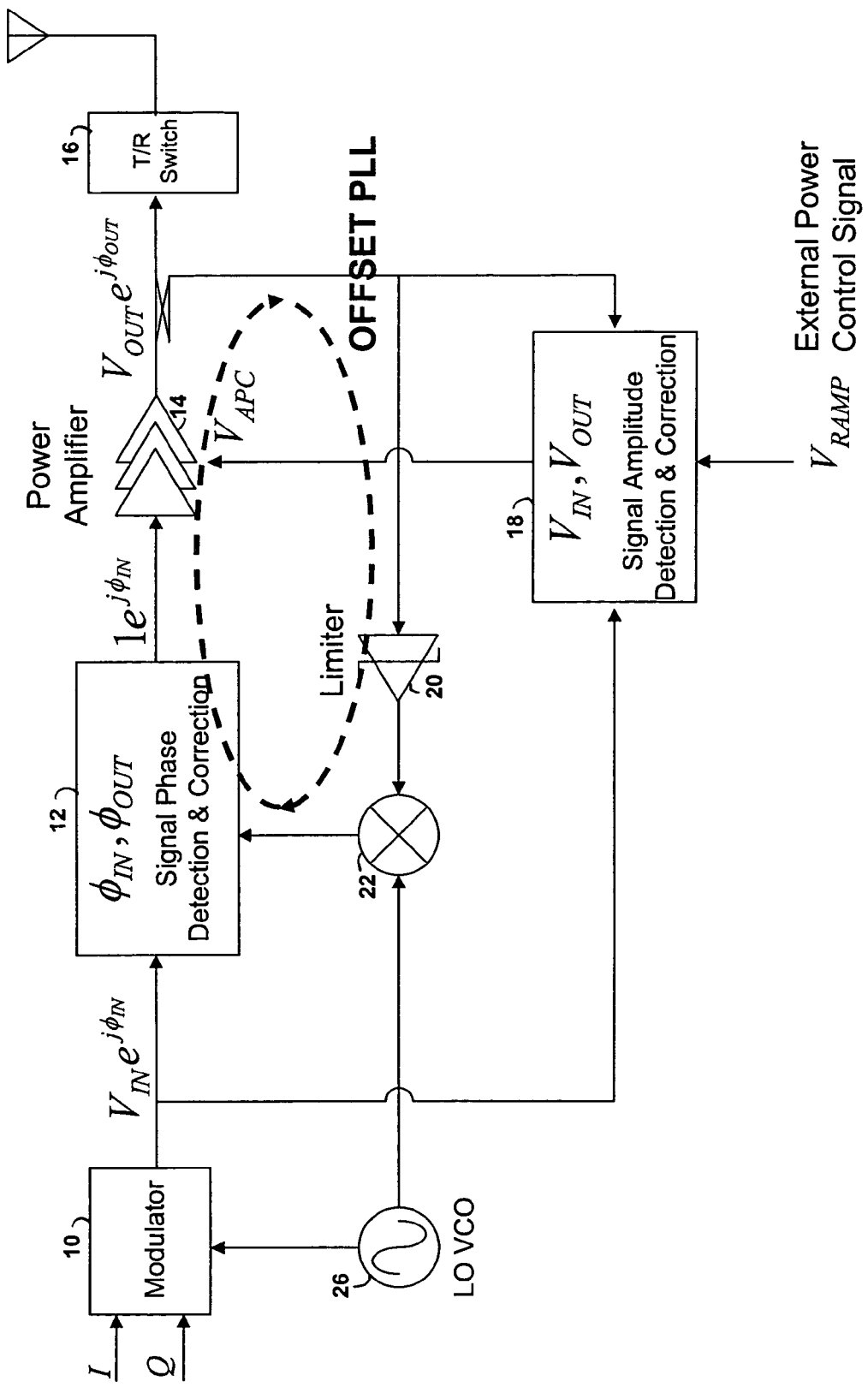
FIG. 1 shows a diagrammatic functional illustration of a transmitter system in accordance with an embodiment of the invention.

As shown in FIG. 1, a transmitter system in accordance with an embodiment of the invention includes a quadrature modulator system 10 that receives I and Q input signals from the baseband, and produces a modulated signal $V_{IN}e^{j\Phi_{IN}}$ at an intermediate frequency. This signal provides the input to an Offset PLL which is formed by a signal phase detection and correction unit 12 an adjustable power amplifier system 14, a voltage limiter 20, and a mixer 22. The output of the amplifier system 14 is provided to a transmitter/receiver switch 16, which routes the output power to an antenna. The output of the amplifier system 14 is also provided to a signal amplitude and correction unit 18, which provides the control signal to the adjustable power amplifier system 14. The envelope restoration and power control unit 18 also receives an input from the quadrature modulator system 10. The signal from the quadrature modulator system and the signal from the output of the adjustable power amplifier 14 is received by the signal amplitude and correction unit 18, which uses logarithmic power detectors. The signal amplitude and correction unit 18 also receives an input ramp signal $V_{RAMP}$ as shown, which controls the output power strength desired by the wireless network.

The output of the programmable gain amplifier 14 is also provided (via an optional limiter 20) to a mixer 22. The mixer 22 also receives an input from a local oscillator VCO 26. The output of the mixer 22 is provided to the phase detector system 12. The local oscillator generator also provides an output signal to the quadrature modulator 10.

The phase detection unit 12, adjustable power amplifier 14 and feedback loop via the mixer 22 provide the phase information to the output signal, and the amplitude detection unit 18 and adjustable power amplifier 14 provide the amplitude information to the output signal.

The system provides a polar modulator architecture in which the final radio frequency waveform is constructed using a polar representation of the baseband signal. The system employs closed-loop linearization with amplitude distortions being corrected by the amplitude modulating loop (14 and 18). The amplitude modulating loop employs accurate, temperature stable logarithmic detectors. Phase distortions are corrected by a wide bandwidth offset PLL (comprising of items 14, 20, 22 and 12). The loop also includes a power control system employing the same accurate & temperature stable logarithmic detectors and track and hold circuits, which extend the gain measurement system to true power control. The use of highly sensitive limiter circuits in sensing the residual signal leakage power out of the power amplifier system allows the PLL to lock even if the power amplifier 14 is not enabled. This provides advantages for time division multiple access (TDMA) systems such as those conforming to the GSM/EDGE standard. In addition, such a system also includes specially designed filtering in the amplitude modulating (14 and 18) and PLL (14, 20, 22 and 12) paths to accommodate strict timing alignment requirements between the constituent polar signal paths.

The different sub-systems are coupled together since the polar modulator includes closed-loop power control. In applications where certain of the sub-systems are externally sourced, the ability to accurately specify and source the sub-systems may be critical to the ability of the sub-system to satisfy target requirements. In addition, for system robustness, it may be desirable to be able to specify sub-systems with less accuracy, or use components that are second-sourced and not originally specified in an application. The ability to provide some amount of programmability in the system to accommodate variations in parts is advantageous.

The power amplifier system 14 may be packaged separately and use a different fabrication process than that of the remaining portions of the system. Attempting to match parameters on the transmitter with those on the power amplifier system, and tracking them through process parameters is not easily done. It appears therefore, component specifications need complete specification and should meet tight tolerance requirements in view of the importance of the amplitude modulating (AM) loop dynamics in meeting system requirements. The AM loop, which is a type-1 control system, is typically specified by its cutoff frequency. In a type-1 control system, with a pole at DC, this cutoff frequency is directly proportional to DC loop gain. Controlling the loop gain requires controlling the incremental gains of the AM loop components (e.g., the power amplifier system, the feedback logarithmic detector, the variable-gain amplifier and the integrator). The ability to control loop dynamics, therefore provides a high degree of flexibility in component selections.

A logarithmic power detector is optimal for its superior instantaneous power detection accuracy. However, it introduces a potential problem in control loop applications which operate over a wide power range because its incremental gain decreases dB-for-dB with increasing input power. The use of logarithmic power detectors therefore may require some loop-gain equalization when the power amplifier has a control characteristic with constant gain, that is $\partial V_{OUT}/\partial V_{APC}$ is constant. Such a power amplifier is often called a proportional power amplifier, that is one whose radio frequency output voltage is proportional to the voltage at its DC control port.

The fact that the logarithmic detector's incremental gain decreases with input power would give rise to a loop-gain function that is an inverse function of the log-detector input power (and therefore to the power amplifier output power). Left uncontrolled, this affects AM loop dynamics as well as the signal quality of the polar modulator, making time alignment of the phase and amplitude corrected signals very difficult over a range of output powers. Including an element in the control loop whose gain increases as the power amplifier output power increases would lessen the loop gain variation.

The average power amplifier system output power (in dB) is proportional to the ramp voltage, $V_{RAMP}$, due to the use of logarithmic detectors in closed-loop power control. This allows the use of a compensating element whose gain is set by the ramp voltage. One such element is a linear-in-dB variable gain amplifier (VGA). Once a VGA with the appropriate characteristics is included in the AM loop, loop gain variation due to the log-detectors can be eliminated. Loop gain compensation is performed only at the average level of the transmitted signal. When a non-constant envelope signal is transmitted, the VGA only sets the average loop gain. In some applications the instantaneous variation does not significantly degrade the transmitted signal quality. However, it is also possible to provide a system in which the envelope voltage is added to the control signal of the VGA, in which case even the instantaneous loop gain is well controlled over the entire power range of the non-constant envelope system.

Figure 2:
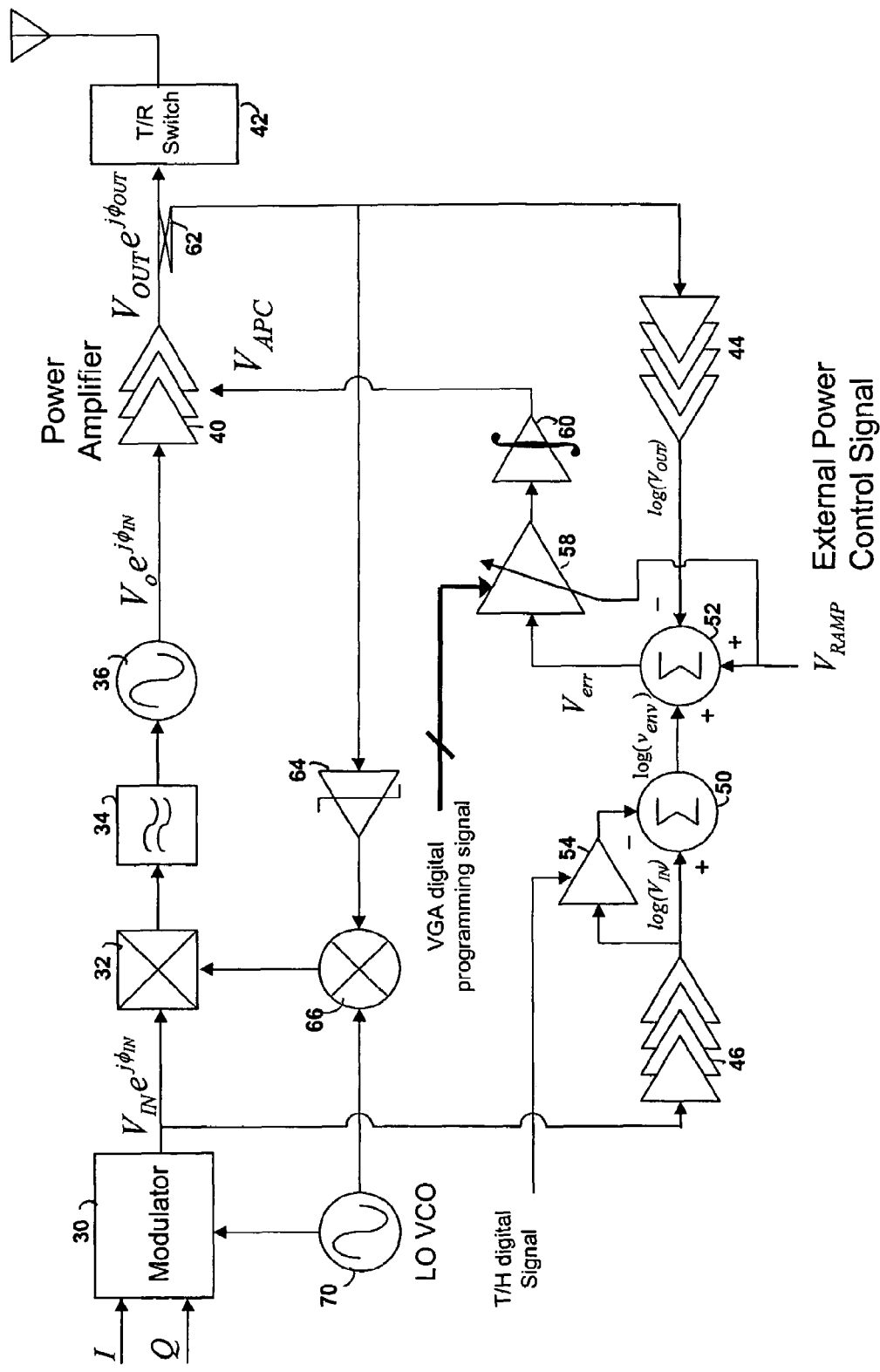
FIG. 2 shows a diagrammatic illustrative circuit view of an implementation of a transmitter system in accordance with an embodiment of the invention.

FIG. 2 shows a circuit in accordance with an embodiment of the invention including a specific implementation of the signal phase detection and correction unit and the signal amplitude detection and correction unit. The circuit includes a quadrature modulator input 30, a phase-frequency detector 32, a low pass filter 34, a transmit VCO 36 and an adjustable power amplifier system 40. The output of the adjustable power amplifier system 40 is coupled to an antenna via a transmit/receive switch 42, as well as to the input of a log amplifier 44 via a power coupler 62. A second log amplifier 46 is coupled to the output of the quadrature modulator unit 30. The signal from the log amplifier 44 is provided to a summer 52, and the signal from the log amplifier 46 is provided to a summer 50. The summer 52 also receives an input from a ramp signal ($V_{RAMP}$).

A track-and-hold amplifier 54 is used to provide true power control as described in US Patent Application 20040235437 "Closed-loop power control for non-constant envelope waveforms using sample/hold", the disclosure of which is hereby incorporated by reference. The track and hold amplifier 54 receives the signal from the log amplifier 46 as well as a track/hold control signal (T/H digital signal). The output of the log amplifier 46 is combined with the output of a track and hold amplifier 54 at the summer 50 and output of the summer 50 is provided to the summer 52 and generates an error signal $V_{err}$.

The output of the summer 52, ($V_{err}$), is provided to a variable gain amplifier 58, and the output of the amplifier 58 is provided to an integrating amplifier 60. The variable gain amplifier 58 also receives a control signal from the ramp input, and receives a gain and slope intercept input settings (VGA digital programming signal).

The logarithmic amplifiers 44 and 46, the track and hold amplifier 54, the summers 50 and 52, and the variable gain amplifier 58 could also operate in current mode with a current representation of the signals $V_{err}$, $\log(V_{IN})$, $\log(V_{OUT})$, $V_{RAMP}$, $\log(v_{env})$.

The output of the adjustable power amplifier system 40 via the power coupler 62 is provided to a limiter unit 64 and a mixer 66. The mixer 66 also receives an input from a local oscillator VCO 70. The output of the mixer 60 is provided to the phase-frequency detector 32.

During use, the log amplifiers 44 and 46, track/hold amplifier 54, variable gain amplifier 58 and integrator 60 function to provide the amplitude information to the output signal ($V_{OUT}$) while maintaining the synchronization of the AM and phase modulation over the entire operating power range.

Figure 3:
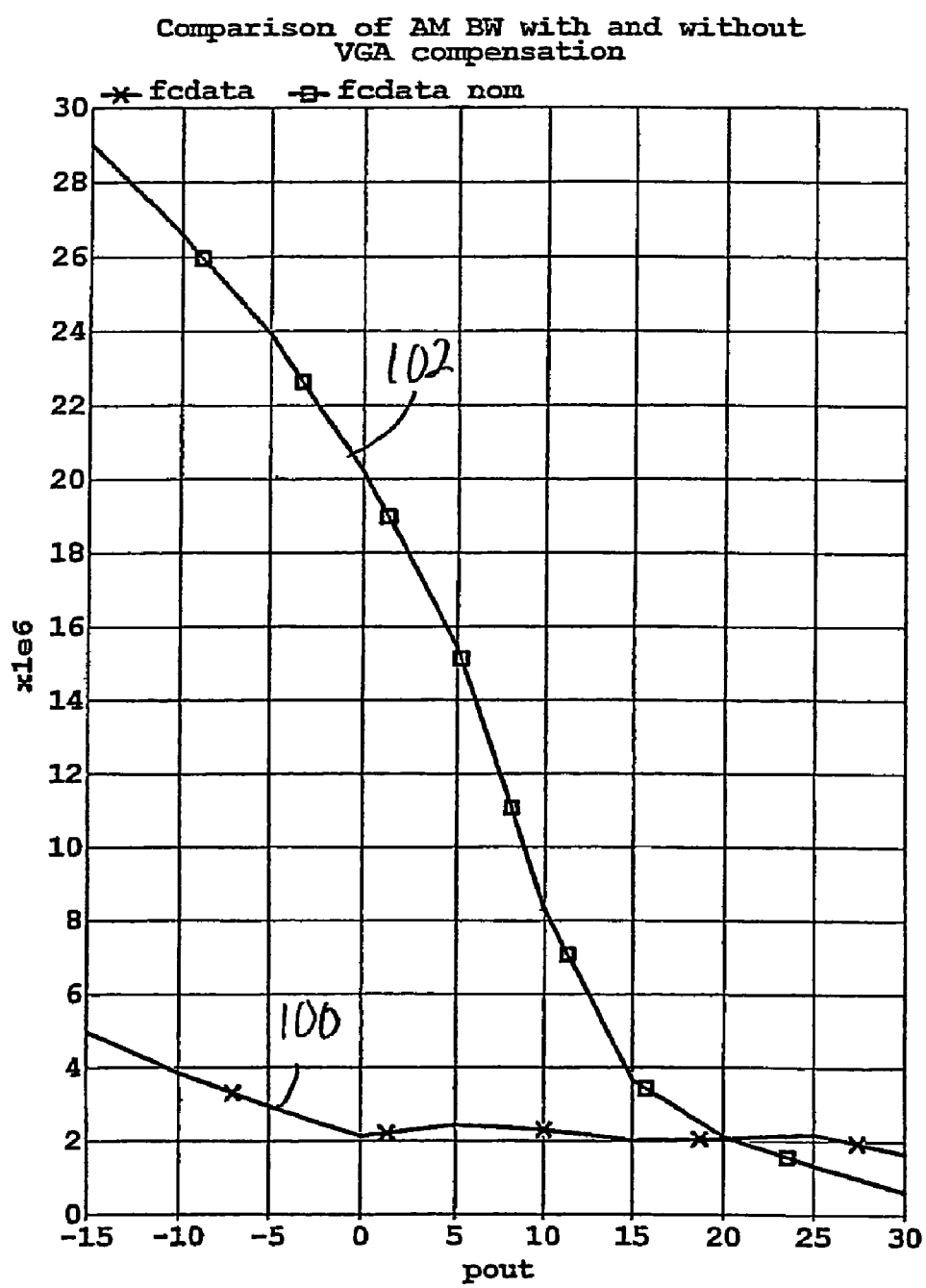
FIG. 3 shows a diagrammatic graphical representation of a comparison of amplitude modulation bandwidth both with and without variable gain amplifier compensation.
Figure 4:
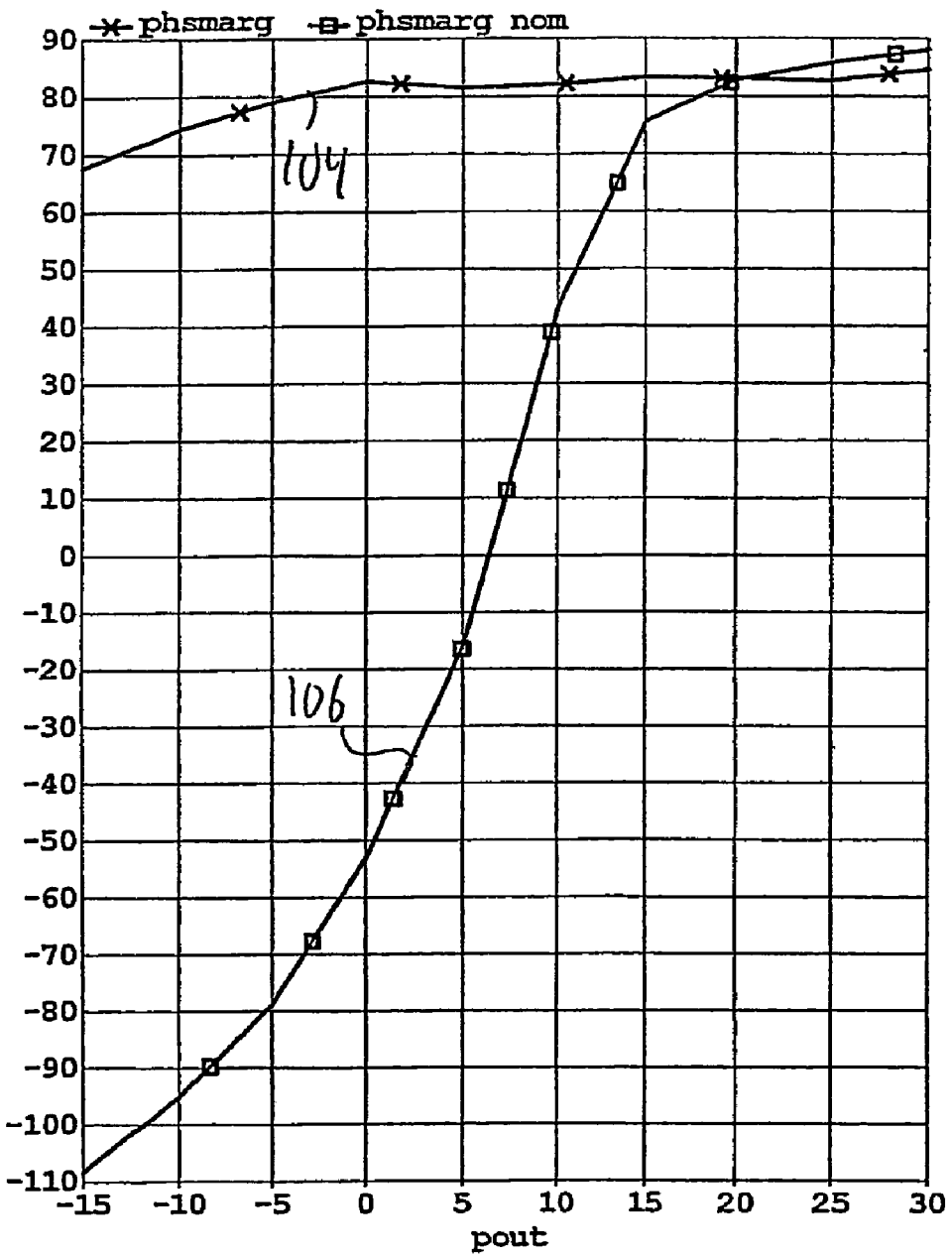
FIG. 4 shows a diagrammatic graphical representation of a comparison of phase margin at nominal RMS power level both with and without variable gain amplifier compensation.

FIG. 3 shows a comparison of AM loop bandwidth with and without VGA gain compensation in accordance with an embodiment of the invention. In particular, the loop transmission cutoff frequency across power amplifier output power without the use of VGA is shown at 102 and that with the VGA is shown at 100. This figure clearly shows the benefits of the VGA, reducing the variation in AM bandwidth from nearly 20 MHz to less than 1 MHz over the power range of interest. Similarly, FIG. 4 shows a comparison of control loop phase margin at nominal RMS power level both with (at 104) and without (at 106) VGA compensation. FIG. 4 shows that not only is the 3 dB bandwith made constant over output power, but this gain equalization technique also produces a constant loop phase and therefore constant closed-loop bandwith which takes into account any loop-peaking effects.

A typical power amplifier incremental gain in volts/volts for the 800-900 MHz band and for the 1700-1900 MHz band varies considerably even for a PA that notionally has a constant control function. In addition, the same amplitude control loop must operate on both PA's, which have very different control functions. Controlling the AM loop's dynamics with such a power amplifier would be difficult.

Figure 5:
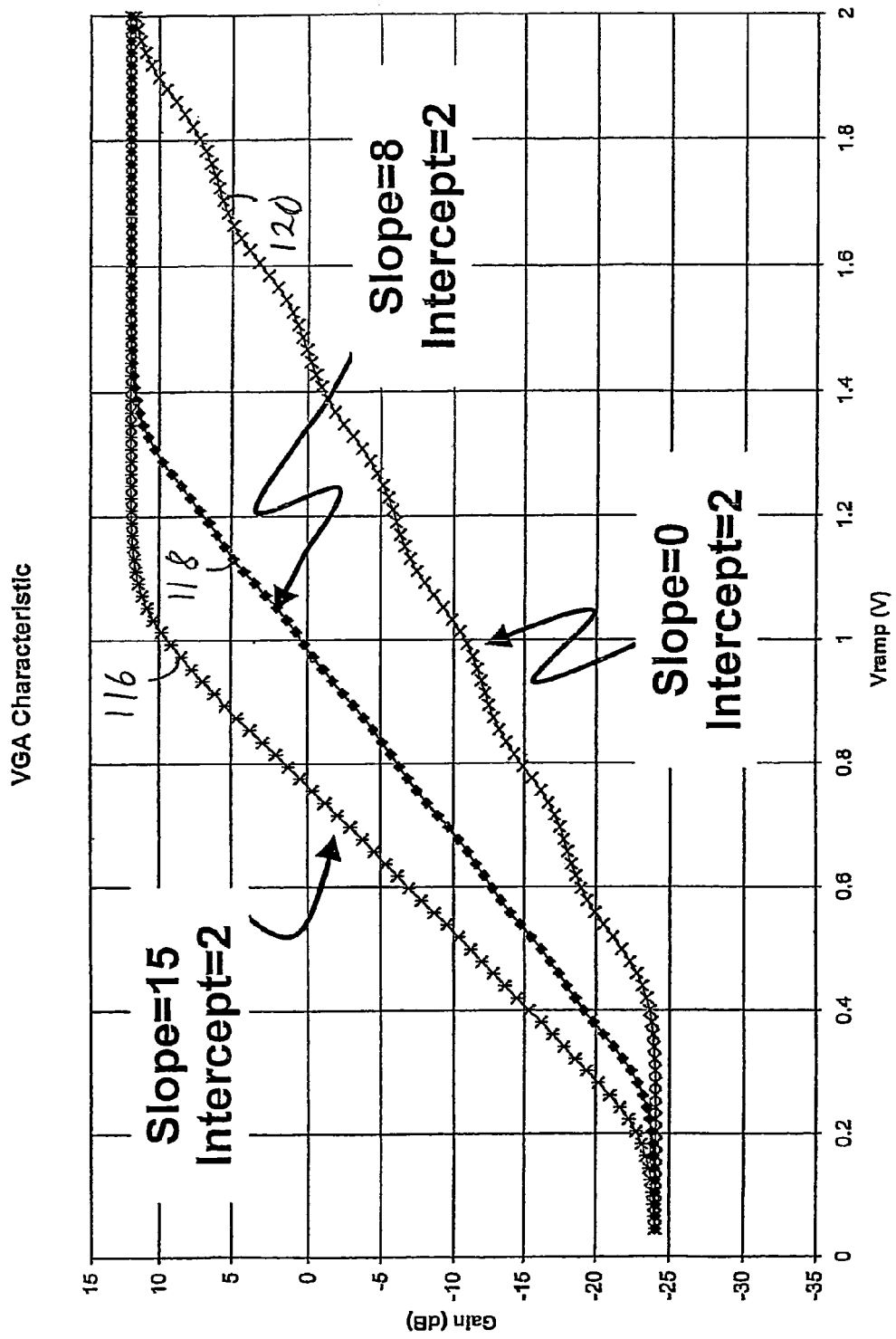
FIG. 5 shows a diagrammatic graphical representation of variable gain amplifier characteristics of systems in accordance with an embodiment of the invention.
Figure 6:
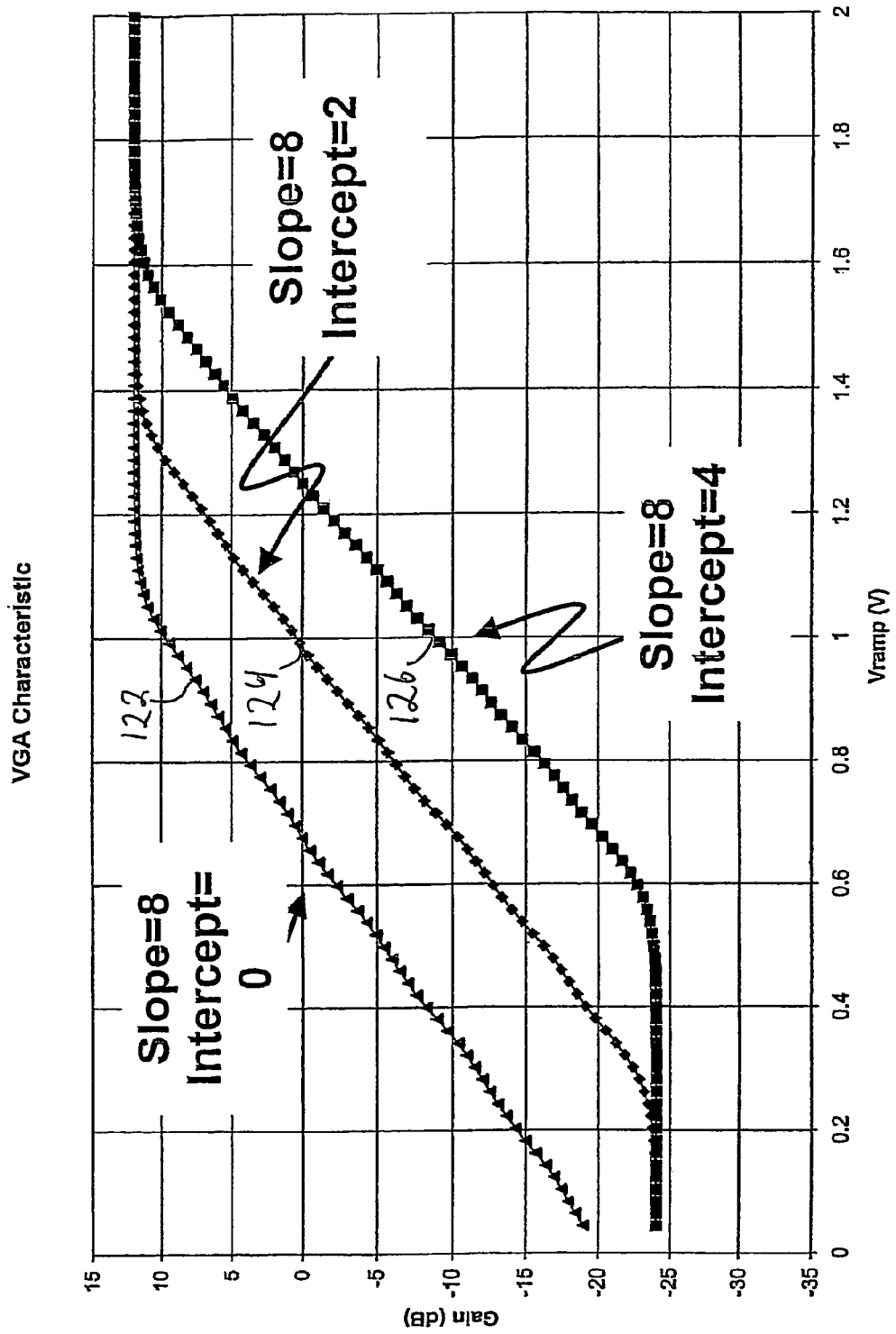
FIG. 6 shows a diagrammatic graphical representation of variable gain amplifier characteristics of further systems in accordance with further embodiments of the invention.

As shown in FIG. 5, when the variable gain amplifier is programmable with regard to slope and intercept, the gain control characteristic may be very precisely controlled over the ramp voltage range. Because the ramp voltage is proportional to the PA output power, the VGA can be used to mitigate the additional gain variation introduced by the PA. In particular, the gain with a slope of 15 and intercept of 2 is shown at 116. The gain with a slope of 8 and intercept of 2 is shown at 118. The gain with a slope of 0 and intercept of 2 is shown at 120. FIG. 6 shows a similar set of gain relationships. The gain with a slope of 8 and intercept of 0 is shown at 122. The gain with a slope of 8 and intercept of 2 is shown at 124, and the gain with a slope of 8 and intercept of 4 is shown at 126 for a system in accordance with an embodiment of the invention. These sets of graphs show that the programmability of the VGA allows the control loop to be tuned for a wide range of PA control characteristics.

Figure 7:
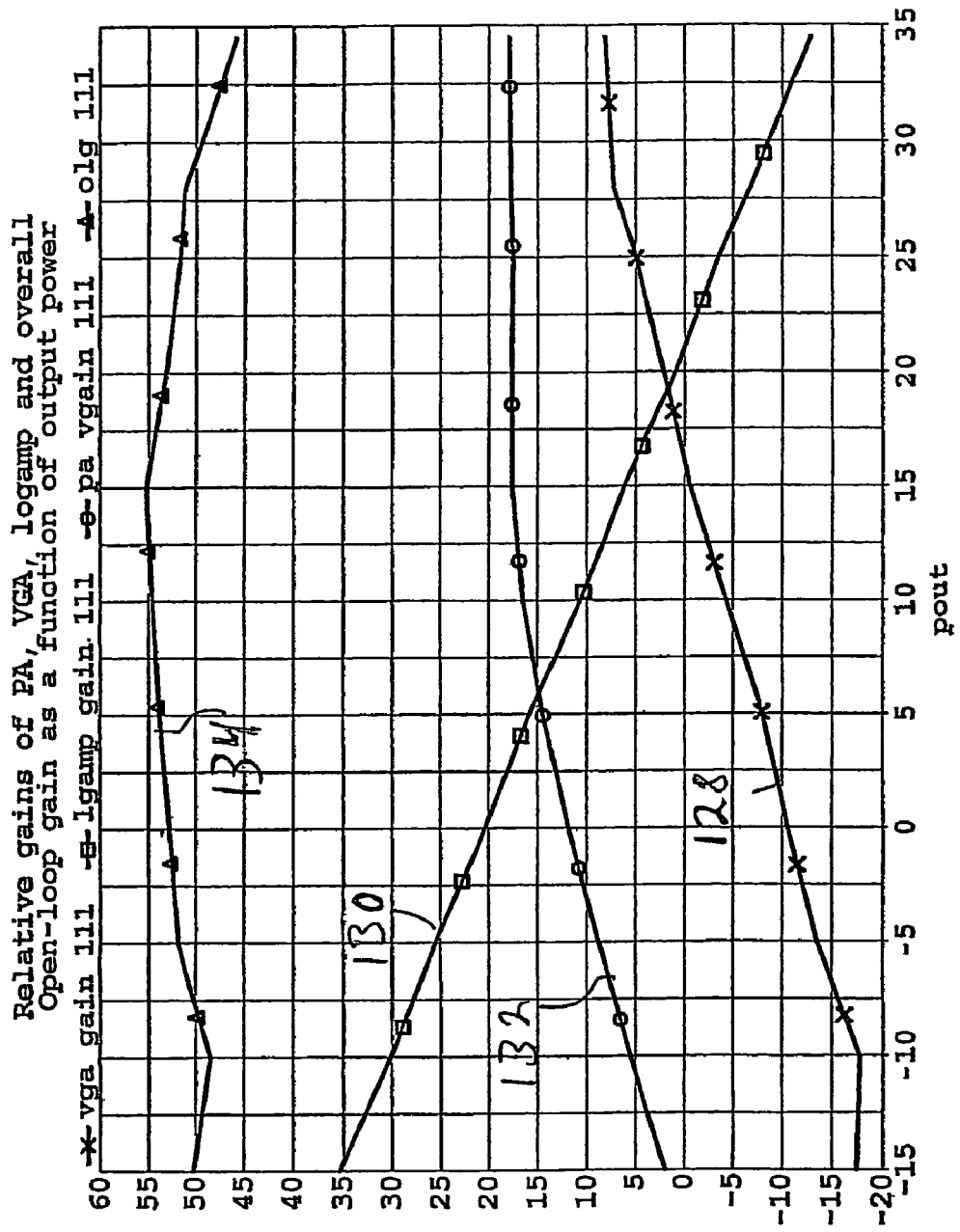
FIG. 7 shows relative gains of the power amplifier, variable gain amplifier and the log amplifier, as well as overall open-loop gain as a function of output power.

FIG. 7 shows the variable gain amplifier gain 128, the log-detector gain 130, the power amplifier gain 132, and the loop gain 134. As shown, the use of the programmable VGA allows the overall loop gain 134 to remain relatively constant over output power, despite the variations in both the log-detector gain and the power amplifier gain. This constant loop gain translates into constant loop bandwidth (and corresponding delay) and therefore facilitates easy time-alignment with a phase loop that similarly has constant delay over output power.

Those skilled in the art will appreciate that numerous modifications and variations may be made to the above disclosed embodiments without departing from the spirit and scope of the invention.

What is claimed is:

1. A transmitter circuit for use in a multi-frequency wireless communication system, said transmitter circuit comprising:
an input modulation unit for receiving at least one signal that is representative of information to be modulated;
a phase modulation system coupled to the input modulation unit for providing a phase modulation on a first output signal, said phase modulation system including a phase detection system and an adjustable power amplifier; and
an amplitude modulation system coupled to the input modulation unit for providing amplitude modulation on the first output signal, said amplitude modulation system including an amplitude detection system for providing a second output signal to said adjustable power amplifier, and a variable gain amplifier coupled to the adjustable power amplifier to ensure substantial time alignment of the amplitude and phase signals over an operating range of power levels, said variable gain amplifier gain is set by a ramp voltage associated with the output power of said adjustable power amplifier to ensure substantial time alignment of the amplitude and phase signals over operating range of power levels.

2. The transmitter as claimed in claim 1, wherein said amplitude modulation system includes at least one log amplifier and a linear-in-dB variable gain amplifier (VGA).

3. The transmitter as claimed in claim 2, wherein said log amplifier is coupled to the first output signal.

4. The transmitter as claimed in claim 2, wherein the amplitude detection system includes an integrating amplifier that is coupled to the output of the linear-in-dB variable gain amplifier.

5. The transmitter as claimed in claim 2, wherein said linear-in-dB variable gain amplifier receives input data regarding gain.

6. The transmitter as claimed in claim 2, wherein said linear-in-dB variable gain amplifier receives input data regarding slope and intercept.

7. The transmitter as claimed in claim 1, wherein said variable gain amplifier receives an input ramp signal that is related to the power of the first output signal.

8. The transmitter as claimed in claim 7, wherein said input ramp signal is proportional to the log of output voltage of the power of the first output signal.

9. The transmitter as claimed in claim 1, wherein the first output signal is coupled to the amplitude modulation system via a first log amplifier, and the input modulation unit is coupled to the amplitude modulation system via a second log amplifier.

10. The transmitter as claimed in claim 1, wherein the amplitude modulation system includes a track and hold amplifier.

11. A transmitter circuit for use in a multi-frequency wireless communication system, said transmitter circuit comprising:
a quadrature modulation unit for receiving I and Q input signals that are representative of information to be modulated;
a phase modulation system coupled to the quadrature modulation unit for providing a phase modulation on a first output signal, said phase modulation system including a phase locked loop and an adjustable power amplifier; and
an amplitude modulation system coupled to the quadrature modulation unit for providing amplitude modulation on the first output signal, said amplitude modulation system for providing a second output signal to said adjustable power amplifier, and including a first log amplifier that is coupled to the first output signal, a linear-in-dB variable gain amplifier coupled to the adjustable power amplifier to ensure substantial time alignment of the amplitude and phase signals over an operating range of power levels, said variable gain amplifier gain is set by a ramp voltage associated with the output power said adjustable power amplifier to ensure substantial time alignment of the amplitude and phase signals over an operating range of power levels.

12. The transmitter as claimed in claim 11, wherein said amplitude modulation system including a track and hold amplifier.

13. The transmitter as claimed in claim 11, wherein the quadrature modulation unit is coupled to the amplitude modulation system via a second log amplifier.

14. The transmitter as claimed in claim 11, wherein said linear-in-dB variable gain amplifier receives input data regarding gain.

15. The transmitter as claimed in claim 11, wherein said linear-in-dB variable gain amplifier receives input data regarding slope and intercept.

16. The transmitter as claimed in claim 11, wherein said variable gain amplifier receives an input ramp signal that is related to the power of the first output signal.

17. A method for generating a first output signal in a transmitter circuit for use in a multi-frequency wireless communication system, said method comprising the steps of:

receiving at least one signal that is representative of information to be modulated;

providing a phase modulation on the first output signal using a phase locked loop and an adjustable power amplifier; and providing amplitude modulation on the first output signal using an amplitude modulation system, said amplitude modulation system including an amplitude detection system for providing a second output signal to the adjustable power amplifier using a variable gain amplifier to ensure substantial time alignment of the amplitude and phase signals over an operating range of power levels, said variable gain amplifier gain is set by a ramp voltage associated with the output power of said adjustable power amplifier to ensure substantial time alignment of the amplitude and phase signals over said operating range of power levels.

18. The method as claimed in claim 17, wherein said amplitude modulation system includes at least one log amplifier.

19. The method as claimed in claim 17, wherein the amplitude detection system includes an integrating amplifier that is coupled to the output of the variable gain amplifier.

20. The method as claimed in claim 17, wherein the amplitude detection system includes a linear-in-dB variable gain amplifier.

21. The method as claimed in claim 17, wherein said variable gain amplifier receives an input ramp signal that is related to the power of the first output signal.

* * * * *